United States Patent
Cheng

(10) Patent No.: US 12,035,611 B2
(45) Date of Patent: Jul. 9, 2024

(54) DISPLAY PANEL AND ELECTRONIC DEVICE

(71) Applicant: WUHAN CHINA STAR OPTOELECTRONICS SEMICONDUCTOR DISPLAY TECHNOLOGY CO., LTD., Wuhan (CN)

(72) Inventor: Xueyin Cheng, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 17/623,207

(22) PCT Filed: Nov. 25, 2021

(86) PCT No.: PCT/CN2021/133195
§ 371 (c)(1),
(2) Date: Dec. 27, 2021

(87) PCT Pub. No.: WO2023/082344
PCT Pub. Date: May 19, 2023

(65) Prior Publication Data
US 2024/0032411 A1 Jan. 25, 2024

(30) Foreign Application Priority Data
Nov. 12, 2021 (CN) .......................... 202111337284.X

(51) Int. Cl.
*H10K 77/10* (2023.01)
*H10K 102/00* (2023.01)

(52) U.S. Cl.
CPC ...... *H10K 77/111* (2023.02); *H10K 2102/311* (2023.02); *H10K 2102/351* (2023.02)

(58) Field of Classification Search
CPC ..................................................... H10K 77/111
See application file for complete search history.

(56) References Cited

U.S. PATENT DOCUMENTS

| | | | |
|---|---|---|---|
| 9,910,458 B2* | 3/2018 | Watanabe | ............. G06F 1/16 |
| 10,559,767 B2* | 2/2020 | Li | ............. G06F 1/1652 |

(Continued)

FOREIGN PATENT DOCUMENTS

| | | |
|---|---|---|
| CN | 108076602 A | 5/2018 |
| CN | 110853520 A | 2/2020 |
| CN | 211087785 U | 7/2020 |

(Continued)

OTHER PUBLICATIONS

PCT International Search Report for International Application No. PCT/CN2021/133195, mailed on Mar. 28, 2022, 8pp.

(Continued)

*Primary Examiner* — Lisa Lea-Edmonds
(74) *Attorney, Agent, or Firm* — The Roy Gross Law Firm, LLC; Roy Gross

(57) ABSTRACT

The present application provides a display panel and an electronic device. A support plate of the display panel includes a support member stacked in multiple layers. An area of a first support member corresponding to the first bending area is hollowed out. A calendered direction of the first support member is perpendicular to a bending axis of the second bending area. An area of a second support member corresponding to the second bending area is hollowed out. A calendered direction of the second support member is perpendicular to a bending axis of the first bending area to alleviate the fracture risk of the metal support.

20 Claims, 8 Drawing Sheets

(56) References Cited

U.S. PATENT DOCUMENTS

| | | | |
|---|---|---|---|
| 11,139,453 B2* | 10/2021 | Wang | H04M 1/0268 |
| 11,696,412 B2* | 7/2023 | Wu | G02F 1/133305 |
| | | | 361/807 |
| 11,711,456 B2* | 7/2023 | Han | G06F 1/1616 |
| | | | 455/575.3 |
| 2014/0183473 A1* | 7/2014 | Lee | G06F 1/1641 |
| | | | 257/40 |
| 2017/0062773 A1* | 3/2017 | Lee | H10K 50/844 |
| 2017/0315645 A1 | 11/2017 | Park et al. | |
| 2018/0103553 A1* | 4/2018 | Kim | H04M 1/0268 |
| 2019/0035765 A1* | 1/2019 | Kim | B32B 15/18 |
| 2019/0146261 A1* | 5/2019 | Im | G02F 1/133305 |
| | | | 349/106 |
| 2022/0167509 A1* | 5/2022 | Wu | H10K 77/111 |
| 2022/0312604 A1* | 9/2022 | Feng | B32B 3/14 |
| 2023/0049246 A1* | 2/2023 | Wang | H10K 77/111 |
| 2023/0096985 A1* | 3/2023 | Chen | B32B 7/12 |
| | | | 257/40 |
| 2023/0157131 A1* | 5/2023 | Tang | G09F 9/301 |
| | | | 361/679.01 |

FOREIGN PATENT DOCUMENTS

| | | |
|---|---|---|
| CN | 112037662 A | 12/2020 |
| CN | 112542090 A | 3/2021 |
| CN | 112614433 A | 4/2021 |
| CN | 112908174 A | 6/2021 |
| CN | 112991959 A | 6/2021 |

OTHER PUBLICATIONS

PCT Written Opinion of the International Searching Authority for International Application No. PCT/CN2021/133195, mailed on Mar. 28, 2022, 9pp.

* cited by examiner

US 12,035,611 B2

DISPLAY PANEL AND ELECTRONIC DEVICE

CROSS REFERENCE TO RELATED APPLICATIONS

This application is a National Phase of PCT Patent Application No. PCT/CN2021/133195 having International filing date of Nov. 25, 2021, which claims the benefit of priority of Chinese Application No. 202111337284.X filed on Nov. 12, 2021. The contents of the above applications are all incorporated by reference as if fully set forth herein in their entirety.

FIELD OF INVENTION

This application relates to the field of display technology, and in particular to a display panel and an electronic device.

BACKGROUND OF INVENTION

Flexible Organic Light Emitting Diode (OLED) Display has the advantages of active light emission, large viewing angle, wide color gamut, high brightness, fast response speed, low power consumption, and structural flexibility and foldability, so as to be more and more popular in the market. Foldable display devices can be prepared in multiple shapes by the bendable and foldable characteristics of the flexible OLED display so are convenient for storing and carrying out. Considering the relatively thin and light characteristics of flexible OLED displays, the metal supports needs to improve the overall supportability, tensile strength, and impact resistance of the display. However, the elastic modulus of the metal support is relatively large, which is basically more than 1000 times that of the glue material bonded to it; therefore, during the bending process of the flexible OLED display, the metal support is prone to stress concentration, so that the stress cannot be released in time, resulting in the fracture risk of the metal support.

SUMMARY OF INVENTION

The present application provides a display panel and an electronic device to alleviate technical problems of breaking risk of the metal support member of the existing flexible OLED display during the bending process.

In order to solve the above problems, technical solutions provided by this application are as follows:

The embodiment of this application provides a display panel, including a first bending area and a second bending area, wherein the display panel includes a display component and a support plate attached to a light-emitting side away from the display component, the support plate includes a first support member hollowed out in an area corresponding to the first bending area, a second support member hollowed out in an area corresponding to the second bending area, and a first adhesive layer arranged between the first support member and the second support member, a calendered direction of the first support member is perpendicular to a bending axis of the second bending area, and a calendered direction of the second support member is perpendicular to a bending axis of the first bending area.

In the display panel provided by the embodiment of the present application, a first included angle is formed between the bending axis of the first bending area and the bending axis of the second bending area.

In the display panel provided by the embodiment of the present application, the first support member has a mesh shape in an area corresponding to the second bending area, and/or the second support member has a mesh shape in an area corresponding to the first bending area.

In the display panel provided by the embodiment of the present application, the support plate further including: a third supporting member, hollowed out in an area corresponding to the first bending area and an area corresponding to the second bending area; and a second adhesive layer, arranged between the second supporting member and the third supporting member.

In the display panel provided by the embodiment of the present application, a third bending area, wherein the bending axis of the third bending area is perpendicular to the calendered direction of the third support member, and the first support member and the second support member are both hollowed out in an area corresponding to the third bending area.

In the display panel provided by the embodiment of the present application, the bending axis of the first bending area and the bending axis of the second bending area are parallel, and the bending axis of the second bending area and the bending axis of the third bending area are also parallel.

In the display panel provided by the embodiment of the present application, a first included angle is formed between the bending axis of the first bending area and the bending axis of the second bending area, and a second included angle is formed between the bending axis of the second bending area and the bending axis of the third bending area.

In the display panel provided by the embodiment of the present application, the first support member has a mesh shape in an area corresponding to the second bending area, the second support member has a mesh shape in an area corresponding to the first bending area, and/or the third support member has a mesh shape in an area corresponding to the third bending area.

In the display panel provided by the embodiment of the present application, the first support member, the second support member, and the third support member have the same material, which includes stainless steel and/or titanium alloy foil.

In the display panel provided by the embodiment of the present application, the thicknesses of the first support member, the second support member, and the third support member range from 0.02 mm to 0.15 mm.

The embodiment of the present application also provides an electronic device, including a housing and a display panel located in the housing; wherein the display panel includes one of the display panel of the above embodiments In the display panel and the electronic device provided by the present application, a display panel includes a first bending area, a second bending area, a display component, and a support plate attached to a light-emitting side away from the display component; the support plate includes a multi-layer stack of support members, and every two adjacent layers of the support members are bonded by an adhesive layer; the first support member is hollowed out in an area corresponding to the first bending area, and the second support member is hollowed out in an area corresponding to the second bending area; the calendered direction of the first support member is perpendicular to the bending axis of the second bending area, and the calendered direction of the second support member is perpendicular to the bending axis of the first bending area; so that ensures the best mechanical performance of the support plate in each bending direction of the display panel, reduces the bending stress of the support plate during the bending process, and realizes the bending with a smaller bending radius; at the same time, the deformation of the rubber material between each layer of support members during the bending process can also absorb a certain stress, reduce the bending stress of the support plate during the bending process, and solve issues of the fracture risk of the metal support member of the flexible OLED display during the bending process.

DESCRIPTION OF DRAWINGS

In order to describe the embodiments or the technical solutions in the prior art clearly, the following will briefly introduce the drawings that need to be used in the description of the embodiments or the prior art. Obviously, the drawings in the following description are only some embodiments of the invention; therefore, other drawings can be obtained by those of ordinary skill in the art based on these drawings without creative work.

DETAILED DESCRIPTION OF EMBODIMENTS

Figure 1:
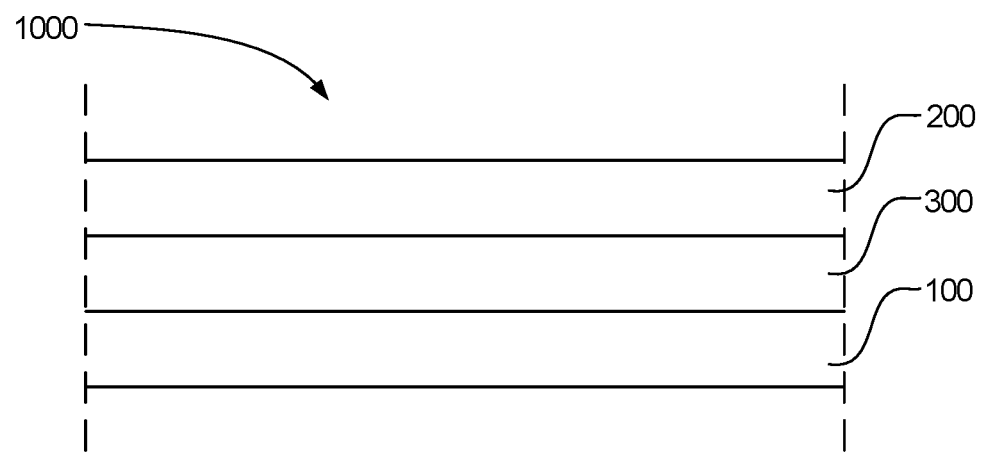
FIG. 1 is a schematic diagram of a cross-sectional structure of a display panel provided by an embodiment of the application.

The description of the following embodiments refers to the attached drawings to illustrate specific embodiments that can be implemented in the present application. The directional terms mentioned in this application, such as up, down, front, back, left, right, inner, outer, side . . . etc., only refer to the directions of the attached drawings; therefore, the directional terms used are used to illustrate and understand the application, rather than to limit the application. In the drawings, units with similar structures are represented by the same reference numerals, and for clear understanding and ease of description, the thickness of some layers and regions may be exaggerated; that is, the size and thickness of each component shown in the drawings are arbitrarily shown, but the application is not limited thereto.

Figure 2:
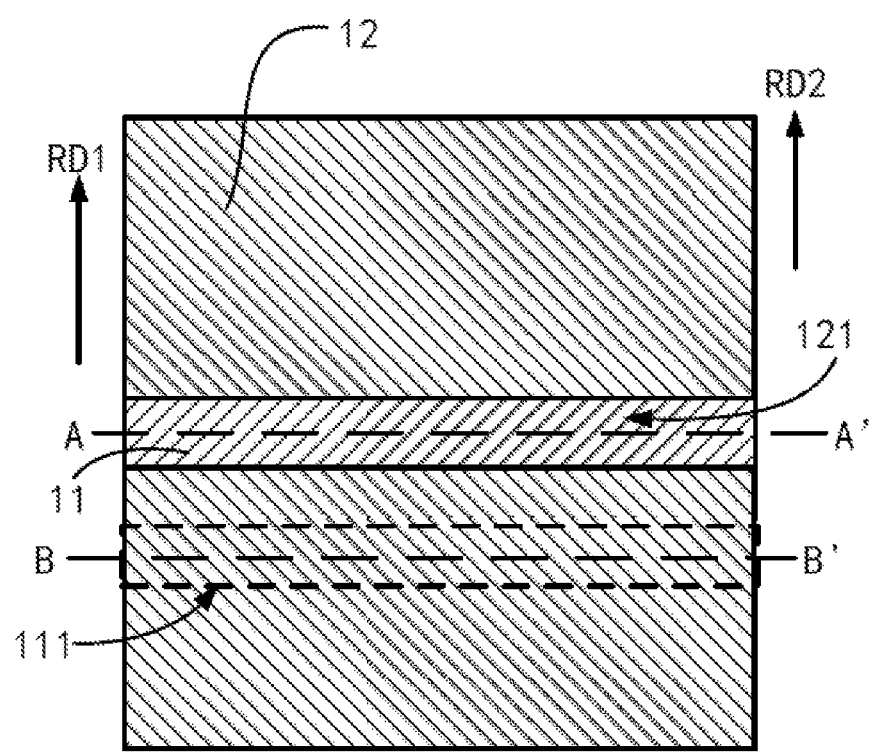
FIG. 2 is a schematic top view of a structure of a supporting plate provided by an embodiment of the application.
Figure 3:
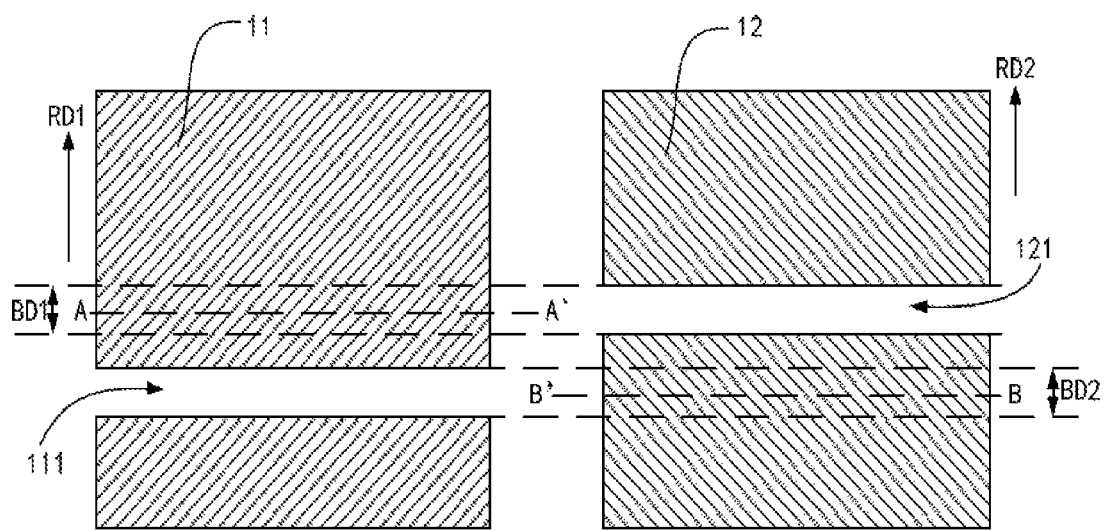
FIG. 3 is a schematic view of the top view structure of each support member on the support plate in FIG. 2.

Please refer to FIG. 1 to FIG. 3: FIG. 1 is a schematic diagram of a cross-sectional structure of a display panel provided by an embodiment of the application, FIG. 2 is a schematic diagram of a top view structure of a support plate provided by an embodiment of the application, and FIG. 3 is a schematic top view of the structure of each supporting member on the supporting plate in FIG. 2. The display panel 1000 include a first bending area BD2 and a second bending area BD1, wherein the bending axis A-A' of the second bending area BD1 and the bending axis B-B' of the first bending area BD2 are parallel; the display panel 1000 also includes a display component 200 and a support plate 100 attached to the light-emitting side away from the display component 200. The display panel 1000 may be an OLED display panel, a QLED display panel, a QD-OLED display panel, or a liquid crystal display panel, etc. Taking the display panel 1000 as an OLED display panel as an example, the display component 200 may include a substrate, a driving circuit layer, a light-emitting function layer, an encapsulation layer, etc., which are sequentially disposed on the substrate.

Optionally, a backplane 300 may be further provided between the support plate 100 and the display component 200 to further enhance the structural reinforcement and heat dissipation effect of the display component 200. Wherein, the backplane 300 could be fixed on the side away from the light-emitting surface of the display component 200 by a pressure sensitive adhesive or the like; the support plate 100 could be fixed on the side of the backplane 300 away from the display component 200 by OCA optical adhesive. The backplane 300 may be one or a combination of at least two of foam, graphite layer, copper foil, and the like.

The supporting plate 100 includes multiple layers of supporting members arranged in a stack, and every two adjacent layers of supporting members are bonded by an adhesive layer. Specifically, the support plate 100 includes a first support member 11 and a second support member 12; the first support member 11 is hollowed out in an area corresponding to the first bending area BD2 to form a first hollow area 111 of the first support member 11, and the second supporting member 12 is hollowed out in an area corresponding to the second bending area BD1 to form a first hollowed-out area 121 of the second supporting member 12. In the present application, the support member hollowed out in the corresponding bending area means that the support member is completely disconnected in the corresponding bending area.

In this embodiment, the supporting plate 100 is provided with the first supporting member 11 and the second supporting member 12 laminated, the area of the first support member 11 corresponding to the first bending area BD2 is hollowed out, and the area of the second support member 12 corresponding to the second bending area BD1 is hollowed out; so that the second support member 12, not the first support member 11, of the support plate 100 bears the force when the display panel 1000 is bent along the first bending area BD2; in the other hand, the first support member 11, not the second support member 12, of the support plate 100 bears the force when the display panel 1000 is bent along the second bending area BD1. Hence, compared with a single-layer support plate structure of the same thickness, the support plate 100 of the present application reduce the load-bearing structure corresponding to the second bending area BD1 and the first bending area BD2, so as to reduce the bending stress of the second bending area BD1 and the first bending area BD2 and to avoid breakages of the support plate 100 due to stress concentration effectively when bending.

At the same time, the first support member 11 and the second support member 12 are bonded by a first adhesive layer 21, so that the first support member 11 and the second support member 12 are joined together to form the supporting plate 100. Optionally, the material of the first adhesive layer 21 could be a pressure sensitive adhesive (PSA) and other sticky adhesive materials. Since the first support member 11 and the second support member 12 are bonded together with the adhesive material, the adhesive material deforms and absorbs a certain bending stress during the bending process of the support plate 100, so as to further reduce the bending stress in the bending area and to avoid the breakage of the support plate 100 effectively due to stress concentration when bending.

Optionally, the first support member 11 and the second support member 12 may be the same material, which may be metals, such as stainless steel (SUS), structural steel, and titanium alloy foil, but the materials of the first support member 11 and the second support member 12 could be different.

When the material of the first support member 11 and the second support member 12 are metal, such as stainless steel, the bending axis A-A' of the second bending area BD1 is perpendicular to the calendered direction RD1 of the first support member 11, and the bending axis B-B' of the first bending area BD2 is perpendicular to the calendered direction RD2 of the second support member 12. Metal materials such as stainless steel used for supporting members are usually prepared by rolling and rolling, and the rolling and rolling process makes the crystal grains of stainless steel and other metal materials elongate in the rolling or calendered direction to form a fibrous structure and to make the material anisotropic. There is obvious difference between the material property in calendered direction and the material property perpendicular to the calendered direction, wherein the mechanical properties along the calendered direction are higher, such as higher yield strength, tensile strength, elongation, etc., but the mechanical properties perpendicular to the calendered direction are lower. Therefore, in order to prevent the support member of the support plate 100 from breaking when the display panel 1000 is bent, the bending axis of the bending area of the display panel 1000 could be perpendicular to the calendered direction of the support member on the support plate 100 to reduce the bending stress that the support plate 100 receives when the display panel 1000 is bent along the bending area.

Optionally, the thicknesses of the first support member 11 and the second support member 12 are both in the range of 0.02 mm to 0.15 mm. Wherein, the thickness of the first support member 11 and the thickness of the second support member 12 are the same, for example, the thickness of the first support member 11 and the thickness of the second support member 12 are both 0.07 mm; the thickness of the first adhesive layer 21 between the first support member 11 and the second support member 12 is 0.01 mm.

Or alternatively, the thickness of the first support member 11 and the thickness of the second support member 12 are the same. For example, the thickness of the first support member 11 and the thickness of the second support member 12 are both 0.06 mm, and the thickness of the first adhesive layer 21 between the first support member 11 and the second support member 12 is 0.02 mm.

Optionally, in order to further reduce the bending stress of the support plate 100 corresponding to the second bending area BD1 and the first bending area BD2, the first support member 11 has a mesh shape in an area corresponding to the second bending area BD1, and the second supporting member 12 has a mesh shape in an area corresponding to the first bending area BD2; that is, in the second bending area BD1, the first support member 11 includes a pattern formed by a plurality of meshes, and in the first bending area BD2, the second support member 12 includes a pattern formed by a plurality of meshes. The shape of the mesh includes regular or irregular graphics such as long strips: when the mesh is a long strip, the long axis direction of the mesh on the first support member 11 is parallel to the bending axis A-A' of the second bending area BD1, and the long axis direction of the mesh on the second support member 12 is parallel to the bending axis B-B' of the first bending area BD2. Obviously, the present application is not limited to this; the present application can also make one of the first support member 11 and the second support member 12 be provided with a mesh structure in the corresponding bending area, or neither can be provided with a mesh structure.

In addition, the thickness of the first support member 11 and the thickness of the second support member 12 may also be different. For example, the thickness of the first support member 11 is 0.02 mm, the thickness of the second support member 12 is both 0.08 mm, and the thickness of the first adhesive layer 21 between the first support member 11 and the second support member 12 is 0.03 mm. In this way, the thickness of the first support member 11 is already thin, so the bending stress is small; moreover, in order to simplify the process and save the cost, the mesh structure of the first supporting member 11 in the area corresponding to the second bending area BD1 need not be designed.

It should be noted that the thickness of the first support member 11 and the second support member 12 can be selected according to the total thickness of the support plate 100 that is actually required and according to the bending requirements to be achieved; for the support member provided with the bending area, it is determined whether a mesh structure needs to be provided in the corresponding bending area according to the thickness of the support member and according to the bending requirements to be achieved.

In this embodiment, the support plate 100 includes a multi-layer stack of support members, and every two adjacent layers of the support members are bonded by an adhesive layer. The first support member 11 is hollowed out in an area corresponding to the first bending area BD2, and the second supporting member 12 is hollowed out in an area corresponding to the second bending area BD1; the calendered direction RD1 of the first support member 11 is perpendicular to the bending axis A-A' of the second bending area BD1, and the calendered direction RD2 of the second support member 12 is perpendicular to the bending axis B-B' of the first bending area BD2. Therefore, that could ensure that the best mechanical performance of the support plate 100 in each bending direction of the display panel 1000 and reduce the bending stress of the support plate 100 during the bending process, thereby achieving bending with a smaller bending radius; at the same time, the deformation of the adhesive material between each layer of support members during the bending process can also absorb a certain stress, which can further reduce the bending stress of the support plate 100 during the bending process, so as to solve the problem of the fracture risk of the metal support member of the current flexible OLED display during the bending process.

Figure 4:
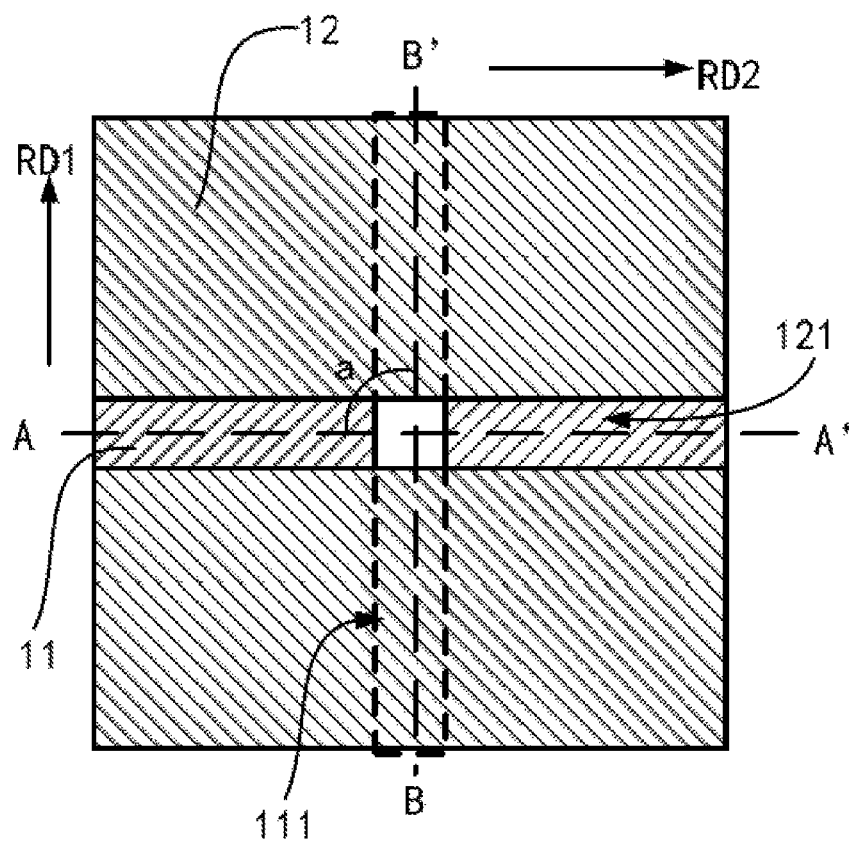
FIG. 4 is a schematic diagram of another top view structure of a support plate provided by an embodiment of the application.
Figure 5:
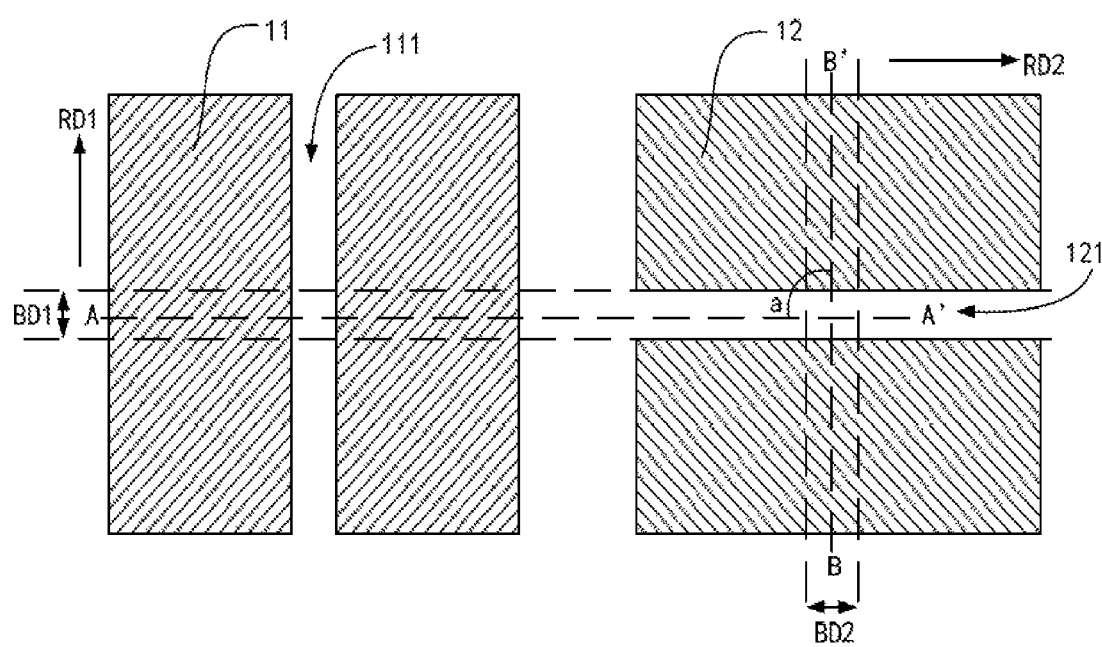
FIG. 5 is a schematic top view of the structure of each supporting member on the supporting plate in FIG. 4.

In an embodiment, please refer to FIGS. 4 and 5. FIG. 4 is a schematic view of another top structure of the support plate provided by an embodiment of the application, and FIG. 5 is a schematic view of the top structure of each support member on the support plate in FIG. 4. The difference from the above embodiment is that the bending axis A-A' of the second bending area BD1 and the bending axis B-B' of the first bending area BD2 are arranged at a first included angle a, and the range of the first included angle a is greater than 0 degrees and less than 180 degrees. In this embodiment, the first included angle a is 90 degrees as an example.

When the first included angle a is 90 degrees, the second bending area BD1 and the first bending area BD2 perpendicularly intersect, so as to realize the cross-folding of the display panel 1000. Moreover, since the calendered direction RD1 of the first support member 11 is perpendicular to the bending axis A-A' of the second bending area BD1, and the calendered direction RD2 of the second support member 12 is perpendicular to the bending axis B-B' of the first bending area BD2; therefore, the calendered direction RD1 of the first supporting member 11 on the supporting plate 100 is perpendicular to the calendered direction RD2 of the second supporting member 12.

In this embodiment, the two bending areas of the display panel 1000 are arranged at a first included angle a; the first supporting member 11 of the supporting plate 100 is hollowed out in an area corresponding to the first bending area BD2, and the second supporting member 12 is hollowed out in an area corresponding to the second bending area BD1; the calendered direction RD1 of the first support member 11 is perpendicular to the bending axis A-A' of the second bending area BD1, and the bending calendered RD2 of the second support member 12 is perpendicular to the bending axis B-B' of the first bending area BD2. Therefore, it could ensure the best mechanical performance of the support plate 100 in each bending direction of the display panel 1000 and reduce the bending stress that the support plate 100 receives during the bending process, so as to realize the bending with a smaller bending radius. At the same time, since the deformation of the adhesive material between the various layers of support members could absorbs a certain stress during the bending process, the bending stress of the support plate 100 during the bending process could be further reduced, so as to achieve the bending requirements of the cross-folding of the display panel 1000 and other bending areas with overlapping areas and to solve the problem of the fracture risk of the metal support member of the current flexible OLED display during the bending process. For other descriptions, please refer to the above-mentioned embodiment, which will not be repeated here.

Figure 6:
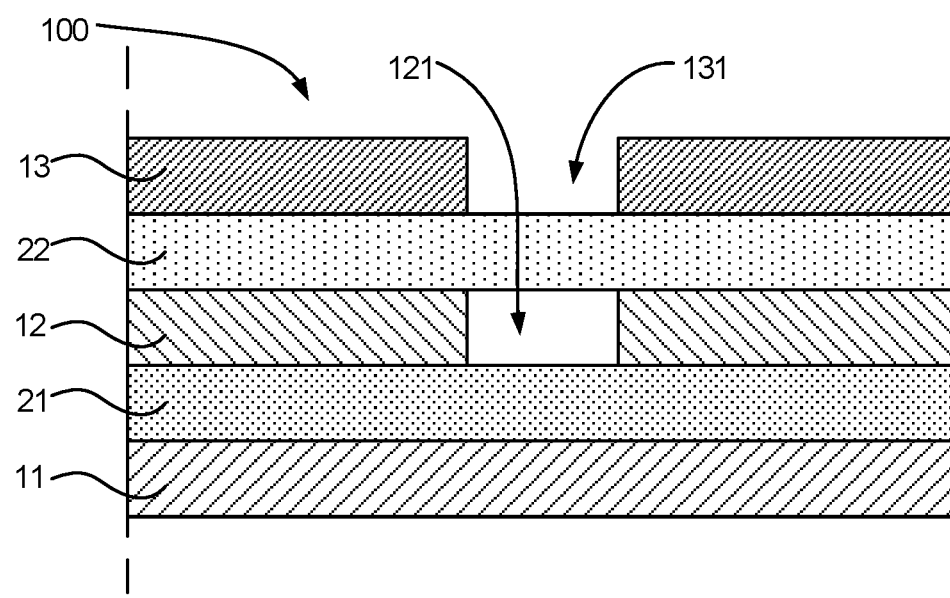
FIG. 6 is a schematic diagram of a cross-sectional structure of a support plate provided by an embodiment of the application.
Figure 7:
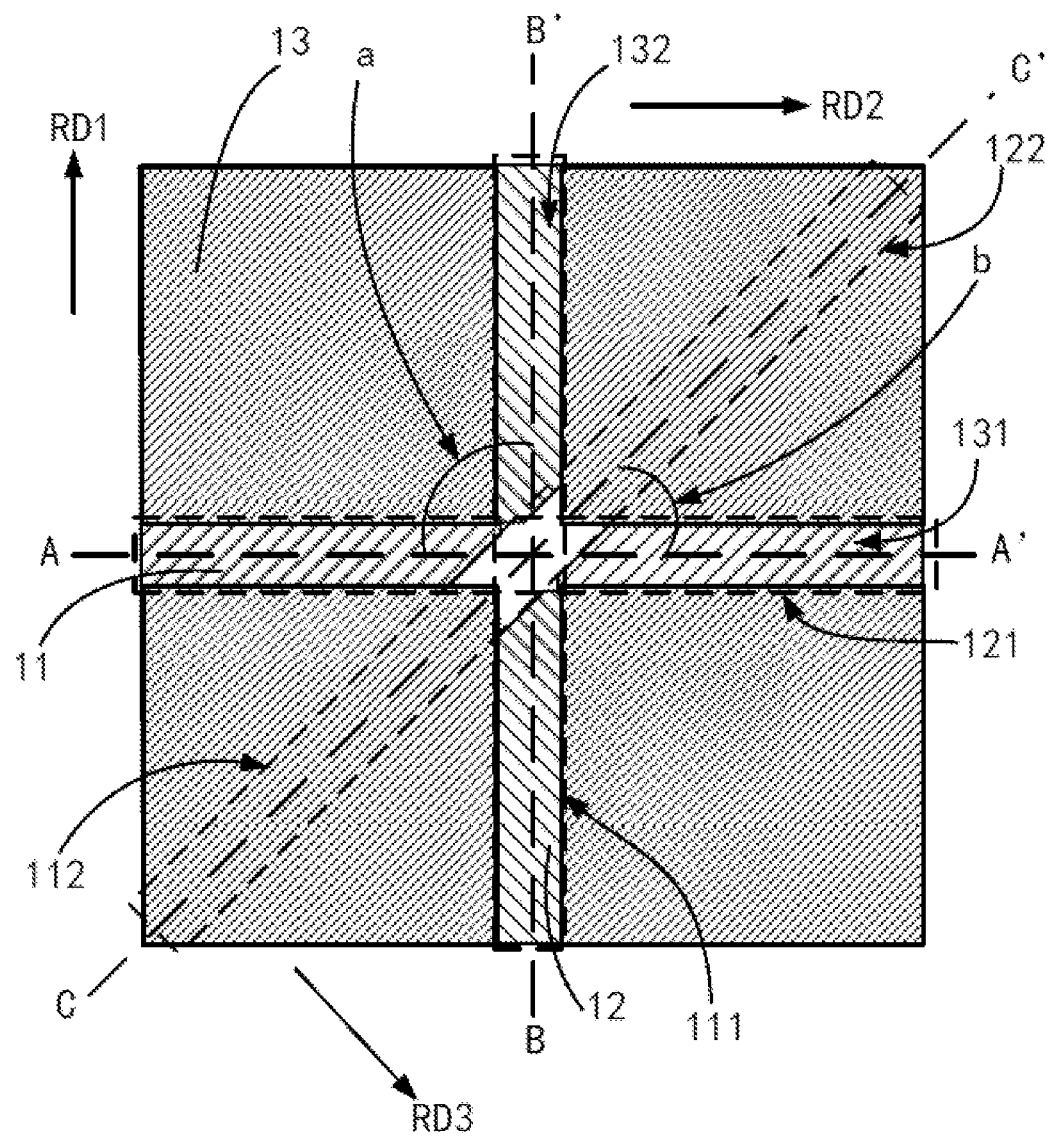
FIG. 7 is a schematic diagram of another top view structure of the support plate provided by the embodiment of the application.
Figure 8:
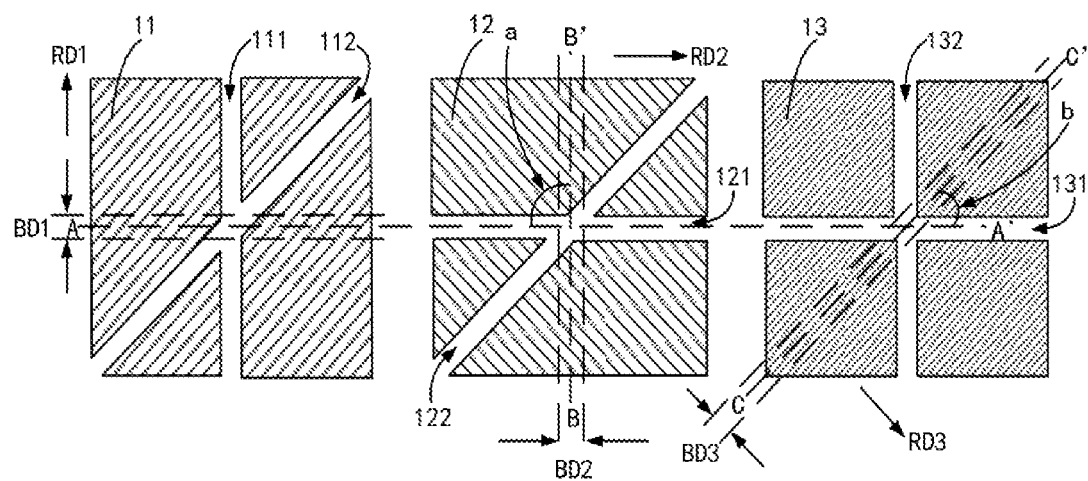
FIG. 8 is a schematic top view of the structure of each supporting member on the supporting plate in FIG. 7.

In an embodiment, please refer to FIGS. 6 to 8 in combination: FIG. 6 is a schematic cross-sectional structure diagram of a support plate provided by an embodiment of the application, FIG. 7 is a schematic diagram of another top view structure of the support plate provided by an embodiment of the application, and FIG. 8 is a schematic top view of the structure of each supporting member on the supporting plate in FIG. 7. The difference from the above embodiment is that the display panel 1000 further has a third bending area BD3; the bending axis A-A' of the second bending area BD1 and the bending axis B-B' of the first bending area BD2 form a first included angle a, the bending axis A-A' of the second bending area BD1 and the bending axis C-C' of the third bending area BD3 form a second included angle b, and the bending axis C-C' of the third bending area BD3 and the bending axis B-B' of the first bending area BD2 are also arranged at a certain angle. The range of the first included angle a is greater than 0 degrees and less than 180 degrees, and the range of the second included angle b is also greater than 0 degrees and less than 180 degrees; hereinafter, in this embodiment, the first included angle a is 90 degrees, and the second included angle b is 45 degrees as an example.

Correspondingly, the supporting plate 100 further includes a third supporting member 13 and a second adhesive layer 22; the third supporting member 13 is hollowed out in an area corresponding to the second bending area BD1 and the first bending area BD2, and both the first supporting member 11 and the second supporting member 12 are hollowed out in an area corresponding to the third bending area BD3.

Specifically, the third supporting member 13 is hollowed out corresponding to the second bending area BD1 to form a first hollowed-out area 131 of the third supporting member 13, and the third supporting member 13 is hollowed out in an area corresponding to the first bending area BD2 to form a second hollowed-out area 132 of the third supporting member 13; the first supporting member 11 is hollowed out corresponding to the third bending area BD3 to form a second hollowed-out area 112 of the first supporting member 11, and the second supporting member 12 is hollowed out in an area corresponding to the third bending area BD3 to form a second hollowed-out area 122 of the second supporting member 12.

Furthermore, the second adhesive layer 22 is provided between the second support member 12 and the third support member 13 for bonding the second support member 12 and the third support member 13, wherein the material of the second adhesive layer 22 may be the same as the material of the first adhesive layer 21.

So that, when the display panel 1000 is bent along the second bending area BD1, the first support member 11 bears force, but the second support member 12 and the third support member 13 do not bear force; when the display panel 1000 is bent along the first bending area BD2, the second support member 12 bears force, but the first support member 11 and the third support member 13 do not bear force; when the display panel 1000 is bent along the third bending area BD3, the third support member 13 bears force, but the first support member 11 and the second support member 12 do not bear force. Therefore, compared with the single-layer support plate structure of the same thickness, the support plate 100 of the present application reduces the load-bearing structure corresponding to the second bending area BD1, the first bending area BD2, and the third bending are BD3, so as to reduce the bending stress of the second bending area BD1, the first bending area BD2, and the third bending area BD3, avoiding from breakage due to stress concentration when the support plate 100 is bent.

Optionally, the thickness of the third support member 13 ranges from 0.02 mm to 0.15 mm, and the thickness of the first support member 11, the thickness of the second support member 12, and the thickness of the third support member 13 are the same. For example, the thicknesses of the first support member 11, the second support member 12, and the third support member 13 are all 0.03 mm, and the thickness of the first adhesive layer 21 and the second adhesive layer 22 are both 0.02 mm.

Surely, in order to further reduce the bending stress of the second bending area BD1, the first bending area BD2, and the third bending area BD3, the first support member 11 is designed in a mesh shape in the second bending area BD1, and/or the second support member 12 is designed in a mesh shape in the first bending area BD2, and/or the third supporting member 13 is designed in a mesh shape in the third bending area BD3; however, this application is not limited to above, the first support member 11, the second support member 12, and the third support member 13 of the present application may be provided with no mesh structure in the corresponding bending area; in this embodiment, no mesh is provided as an example.

Optionally, the material of the third support member 13 is the same as the material of the first support member 11 and the second support member 12; the material of the third support member 13 also includes metals such as stainless steel (SUS), structural steel, and titanium alloy foil; in addition, the materials of the first support member 11, the second support member 12, and the third support member 13 may be different. When the materials of the third support member 13, the first support member 11 and the second support member 12 are all metals, such as stainless steel, the calendered direction RD1 of the first support member 11 is perpendicular to the bending axis A-A' of the second bending area BD1, the calendered direction RD2 of the second support member 12 is perpendicular to the bending axis B-B' of the first bending area BD2, and the bending axis C-C' of the third bending area BD3 is perpendicular to the calendered direction RD3 of the third support member 13; in this way, it could ensure that the best mechanical performance of the support plate 100 in each bending direction of the display panel 1000, reduce the bending stress received by the support plate 100 during the bending process and realize the bending with a smaller bending radius; at the same time, since the deformation of the adhesive material between the various layers of support members could also absorb a certain amount of stress during the bending process, the bending stress received by the support plate 100 during the bending process can be further reduced, so as to realize the bending requirement of the display panel 1000 in more directions.

Understandably, the laminated design of the supporting member of this embodiment is also applicable to the situation where the three bending areas of the display panel 1000 are arranged in parallel; specifically, the bending axis AA' of the second bending area BD1 and the bending axis BB' of the first bending area BD2 are parallel, and the bending axis AA' of the second bending area BD1 and the bending axis C-C' of the third bending area BD3 are also parallel. For other descriptions, please refer to the above-mentioned embodiment, which will not be repeated here.

It should also be noted that the supporting plate 100 of the present application can also include more layers of supporting members, and can also be provided with more bending areas, achieving bending in more directions.

Based on the same inventive concept, the present application also provides an electronic device with a housing and a display panel located in the housing, wherein the display panel includes the display panel of one of the above-mentioned embodiments. The electronic device is an electronic device such as a mobile phone and a tablet.

According to the above embodiment, it can be seen that: the application provides a display panel and an electronic device, wherein the display panel includes a first bending area, a second bending area, a display component, and a support plate attached to the light-emitting side away from the display component. The support plate includes multiple layers of support members stacked on each other, and each two adjacent layers of the support members are bonded by an adhesive layer. The first supporting member is hollowed out in an area corresponding to the first bending area, and the second supporting member is hollowed out in an area corresponding to the second bending area; the calendered direction of the first support member is perpendicular to the bending axis of the second bending area, and the calendered direction of the second support member is perpendicular to the bending axis of the first bending area, so as to ensure the best mechanical performance of the support plate in each bending direction of the display panel and to reduce the bending stress of the support plate during the bending process, and to realize the bending with a smaller bending radius. At the same time, the deformation of the adhesive material between the various layers of support members can also absorb a certain amount of stress during the bending process, reduce the bending stress of the support plate during the bending process, and solve the problem of the fracture risk of the metal support member of the current flexible OLED display during the bending process.

In the above-mentioned embodiments, the description of each embodiment has its own emphasis. For parts that are not described in detail in an embodiment, reference may be made to related descriptions of other embodiments.

The embodiments of the present application are described in detail above, and specific examples are used in this article to illustrate the principles and implementation manners of the present application. The descriptions of the above embodiments are only used to help understand the technical solutions and core ideas of the present application; Those of ordinary skill in the art should understand that they can still modify the technical solutions described in the foregoing embodiments, or equivalently replace some of the technical features; moreover, these modifications or replacements do not cause the essence of the corresponding technical solutions to deviate from the scope of the technical solutions of the embodiments of the present application. The display panel 1000 may be an OLED display panel, a QLED display panel, a QD-OLED display panel, or a liquid crystal display panel, etc.

What is claimed is:

1. A display panel, comprising a first bending area, a second bending area, a display component, and a support plate attached to a side of the display component away from a light-emitting side of the display component, wherein the support plate comprises:
    a first support member comprising an area hollowed out corresponding to the first bending area;
    a second support member comprising an area hollowed out corresponding to the second bending area; and
    a first adhesive layer arranged between the first support member and the second support member; and
    wherein the first support member and the second support member are arranged in a stack and are bonded to each other via the first adhesive layer, a calendered direction of the first support member is perpendicular to a bending axis of the second bending area, and a calendered direction of the second support member is perpendicular to a bending axis of the first bending area.

2. The display panel according to claim 1, wherein the bending axis of the first bending area and the bending axis of the second bending area are arranged at a first included angle.

3. The display panel according to claim 2, wherein an area of the first support member corresponding to the second bending area comprises a mesh structure, and/or an area of the second support member corresponding to the first bending area comprises a mesh structure.

4. The display panel according to claim 1, wherein the support plate further comprises:
    a third supporting member comprising an area hollowed out corresponding to the first bending area and the second bending area; and
    a second adhesive layer arranged between the second supporting member and the third supporting member.

5. The display panel according to claim 4 further comprising a third bending area, wherein a bending axis of the third bending area is perpendicular to a calendered direction of the third support member, and an area of the first support member corresponding to the third bending area and an area of the second support member corresponding to the third bending area are both hollowed out.

6. The display panel according to claim 5, wherein the bending axis of the first bending area and the bending axis of the second bending area are parallel, and the bending axis of the second bending area and the bending axis of the third bending area are also parallel.

7. The display panel according to claim 5, wherein the bending axis of the first bending area and the bending axis of the second bending area are arranged at a first included angle, and the bending axis of the second bending area and the bending axis of the third bending area are arranged at a second included angle.

8. The display panel according to claim 5, wherein an area of the first support member corresponding to the second bending area comprises a mesh structure, an area of the second support member corresponding to the first bending area comprises a mesh structure, and/or an area of the third support member corresponding to the third bending area comprises a mesh structure.

9. The display panel according to claim 4, wherein the first support member, the second support member, and the third support member made of a same material comprising stainless steel or titanium alloy foil.

10. The display panel according to claim 9, wherein thicknesses of the first support member, the second support member, and the third support member range from 0.02 mm to 0.15 mm.

11. A display panel, comprising a first bending area, a second bending area, a display component, and a support plate attached to a side of the display component away from a light-emitting side of the display component, wherein the support plate comprises:
a first support member comprising an area hollowed out corresponding to the first bending area;
a second support member comprising an area hollowed out corresponding to the second bending area; and
a first adhesive layer arranged between the first support member and the second support member; and
wherein the first support member and the second support member are arranged in a stack and are bonded to each other via the first adhesive layer, a calendered direction of the first support member is perpendicular to a bending axis of the second bending area, and a calendered direction of the second support member is perpendicular to a bending axis of the first bending area.

12. The electronic device according to claim 11, wherein a bending axis of the first bending area and the bending axis of the second bending area are arranged at a first included angle.

13. The electronic device according to claim 12, wherein an area of the first support member corresponding to the second bending area comprises a mesh structure, and/or an area of the second support member corresponding to the first bending area comprises a mesh structure.

14. The electronic device according to claim 11, wherein the support plate further comprises:
a third supporting member comprising an area hollowed out corresponding to the first bending area and the second bending area; and
a second adhesive layer arranged between the second supporting member and the third supporting member.

15. The electronic device according to claim 14 further comprising a third bending area, wherein a bending axis of the third bending area is perpendicular to a calendered direction of the third support member, and an area of the first support member corresponding to the third bending area and an area of the second support member corresponding to the third bending area are both hollowed out.

16. The electronic device according to claim 15, wherein the bending axis of the first bending area and the bending axis of the second bending area are parallel, and the bending axis of the second bending area and the bending axis of the third bending area are also parallel.

17. The electronic device according to claim 15, wherein a bending axis of the first bending area and the bending axis of the second bending area are arranged at a first included angle, and the bending axis of the second bending area and the bending axis of the third bending area are arranged at a second included angle.

18. The electronic device according to claim 15, wherein an area of the first support member corresponding to the second bending area comprises a mesh structure, an area of the second support member corresponding to the first bending area comprises a mesh structure, and/or an area of the third support member corresponding to the third bending area comprises a mesh structure.

19. The electronic device according to claim 14, wherein the first support member, the second support member, and the third support member made of a same material comprising stainless steel or titanium alloy foil.

20. The electronic device according to claim 19, wherein thicknesses of the first support member, the second support member, and the third support member range from 0.02 mm to 0.15 mm.

* * * * *